United States Patent
Yoo et al.

(10) Patent No.: US 10,903,799 B2
(45) Date of Patent: Jan. 26, 2021

(54) VARIABLE GAIN LOW NOISE AMPLIFYING APPARATUS WITH PHASE DISTORTION COMPENSATION

(71) Applicant: SAMSUNG ELECTRO-MECHANICS CO., LTD., Suwon-si (KR)

(72) Inventors: Hyun Jin Yoo, Suwon-si (KR); Jong Mo Lim, Suwon-si (KR); Yoo Sam Na, Suwon-si (KR); Hyung Jun Cho, Suwon-si (KR); Yoo Hwan Kim, Suwon-si (KR); Hyun Hwan Yoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 43 days.

(21) Appl. No.: 16/169,133

(22) Filed: Oct. 24, 2018

(65) Prior Publication Data
US 2019/0363680 A1 Nov. 28, 2019

(30) Foreign Application Priority Data
May 25, 2018 (KR) .................. 10-2018-0059891

(51) Int. Cl.
*H03G 3/30* (2006.01)
*H03F 1/32* (2006.01)
*H03F 3/00* (2006.01)

(52) U.S. Cl.
CPC ........... *H03F 1/3205* (2013.01); *H03F 3/005* (2013.01); *H03G 3/3031* (2013.01);
(Continued)

(58) Field of Classification Search
CPC .. H03F 1/3205; H03F 3/005; H03F 2200/213; H03F 2200/294;
(Continued)

(56) References Cited

U.S. PATENT DOCUMENTS

| | | |
|---|---|---|
| 6,208,203 B1 | 3/2001 | Jung et al. |
| 7,486,135 B2 | 2/2009 | Mu |

(Continued)

FOREIGN PATENT DOCUMENTS

| | | |
|---|---|---|
| JP | 2000-31752 A | 1/2000 |
| JP | 2008-28908 A | 2/2008 |

(Continued)

OTHER PUBLICATIONS

Korean Office Action dated Jul. 19, 2019 in corresponding Korean Patent Application No. 10-2018-0059891 (7 pages in English, 6 pages in Korean).

*Primary Examiner* — Khanh V Nguyen
(74) *Attorney, Agent, or Firm* — NSIP Law

(57) ABSTRACT

An amplifying apparatus includes a variable gain amplifying circuit configured to operate in a gain mode selected from a plurality of gain modes in response to a first control signal during operation in an amplification mode, a variable attenuation circuit configured to have an attenuation value that is adjusted in response to a second control signal, and a phase compensation value which compensates for a phase distortion in the selected gain mode, and a control circuit configured to control the selecting of the gain mode, the adjusting of the attenuation value and the phase compensation value, based on the first and second control signals.

19 Claims, 16 Drawing Sheets

(52) U.S. Cl.
CPC .. *H03F 2200/213* (2013.01); *H03F 2200/294* (2013.01); *H03F 2200/421* (2013.01)

(58) Field of Classification Search
CPC ...... H03F 2200/421; H03F 1/223; H03F 3/72; H03F 3/193; H03F 2203/7239; H03F 2200/211; H03F 3/45183; H03G 3/3031; H03G 1/0088; H03G 3/3042; H03G 1/0023; H03G 3/001; H03G 3/3036
USPC ................................ 330/254, 278, 284, 277
See application file for complete search history.

(56) References Cited

U.S. PATENT DOCUMENTS

| | | | |
|---|---|---|---|
| 7,761,065 B2* | 7/2010 | Drogi | H03F 1/0205 |
| | | | 455/126 |
| 8,766,161 B2* | 7/2014 | Kanter | G01J 1/44 |
| | | | 250/208.2 |
| 9,479,126 B2 | 10/2016 | Ilkov et al. | |
| 9,634,631 B2* | 4/2017 | Goss | H03F 1/345 |
| 2011/0090010 A1* | 4/2011 | Oyabu | H03F 1/0261 |
| | | | 330/284 |
| 2017/0126464 A1 | 5/2017 | Soe | |

FOREIGN PATENT DOCUMENTS

| | | |
|---|---|---|
| JP | 2011-211533 A | 10/2011 |
| KR | 10-0789918 B1 | 1/2008 |
| KR | 10-2011-0021046 A | 3/2011 |
| KR | 10-1351248 B1 | 1/2014 |

\* cited by examiner

VARIABLE GAIN LOW NOISE AMPLIFYING APPARATUS WITH PHASE DISTORTION COMPENSATION

CROSS-REFERENCE TO RELATED APPLICATION

This application claims the benefit under 35 USC § 119(a) of Korean Patent Application No. 10-2018-0059891 filed on May 25, 2018 in the Korean Intellectual Property Office, the entire disclosure of which is incorporated herein by reference for all purposes.

BACKGROUND

1. Field

This application relates to a variable gain low noise amplifying apparatus with phase distortion compensation.

2. Description of Related Art

In recent wireless communication systems, an amplifier (power amplifier or low noise amplifier) having higher output power and efficiency and high sensitivity may be implemented to process large amounts of transmission and reception data.

In addition, signals having various amplitudes may be received. Therefore, when a low noise amplifier (LNA) is implemented, a LNA with various gains may be used to achieve greater or maximum performance at an appropriate signal level while receiving a signal, from a very low signal to a large signal, from an antenna. Typically, the LNA may have a gain from 20 dB to −10 dB, and a performance index of the LNA may depend on the gain.

Typically, LNAs have a limited gain mode (GM) for implementing a variable gain and have cores of a plurality of bulky LNAs connected to each other in parallel, accordingly, miniaturization is limited.

In addition, the typical LNAs may not compensate for a phase changed according to a gain variation. Accordingly, performance of the low noise amplifier is lowered by phase discontinuity due to the variation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an amplifying apparatus includes a variable gain amplifying circuit configured to operate in a gain mode selected from a plurality of gain modes in response to a first control signal during operation in an amplification mode, a variable attenuation circuit configured to have an attenuation value that is adjusted in response to a second control signal, and a phase compensation value which compensates for a phase distortion in the selected gain mode, and a control circuit configured to control the selecting of the gain mode, the adjusting of the attenuation value and the phase compensation value, based on the first and second control signals.

The variable attenuation circuit may be connected between a main input terminal and an input terminal of the variable gain amplifying circuit.

The variable attenuation circuit may include first to n-th attenuation circuits which are connected in parallel between the main input terminal and the input terminal of the variable gain amplifying circuit, and are selectively in an ON state during operation in the amplification mode, and each of the first to n-th attenuation circuits may have each of first to n-th phase compensation values which compensate for the phase distortion in each of the plurality of gain modes.

The first attenuation circuit may include a first switch and a second switch connected in series between the main input terminal and the input terminal of the variable gain amplifying circuit, a first resistor and a second resistor connected in series between the first switch and the second switch, and a first phase compensating capacitor which is connected between a connection node between the first and second resistors and a ground.

The n-th attenuation circuit may include a first switch and a second switch connected in series between the main input terminal and the input terminal of the variable gain amplifying circuit, a first resistor and a second resistor connected in series between the first switch and the second switch, and an n-th phase compensating capacitor which is connected between a connection node between the first and second resistors and the ground.

The variable gain amplifying circuit may include an amplifying circuit configured to amplify a signal obtained through an input terminal of the variable gain amplifying circuit, and an output load circuit connected between an output terminal of the amplifying circuit and an output terminal of the variable gain amplifying circuit, and configured to vary a resistance value and a capacitance value to control a gain of the amplifying circuit and a return loss at the output terminal of the variable gain amplifying circuit based on the first control signal.

Each of the first to n-th attenuation circuits may include a resistance value that is varied to obtain different attenuation values, and a capacitance value that is varied to obtain different phase compensation values.

At least one of the first to n-th attenuation circuits may be configured to be in an ON state to perform an operation to compensate for an attenuation and phase distortion for a signal obtained through the main input terminal.

The apparatus may include a bypass circuit connected in parallel with the variable attenuation circuit and the variable gain amplifying circuit between a main input terminal and an output terminal and configured to be in an ON state during an operation of a bypass mode in response to a third control signal.

In a general aspect, an apparatus includes a variable gain amplifying circuit configured to operate in a gain mode selected from a plurality of gain modes in response to a first control signal during operation in an amplification mode, a variable attenuation circuit configured to have an attenuation value that is adjusted in response to a second control signal, and a phase compensation value which compensates for a phase distortion in the selected gain mode, and a bypass circuit connected in parallel with the variable gain amplifying circuit and configured to transmit a signal output from the variable attenuation circuit to an output terminal of the variable attenuation circuit during an operation in a bypass mode in response to a third control signal, wherein the variable attenuation circuit includes an attenuation bypass circuit configured to be in an ON state during operation in the bypass mode, and first to n-th attenuation circuits connected in parallel with the attenuation bypass circuit and are selectively configured to be in the ON state during the operation in the amplification mode.

The variable attenuation circuit may be connected between a main input terminal and an input terminal of the variable gain amplifying circuit.

Each of the first to n-th attenuation circuits may have each of first to n-th phase compensation values which compensate for a phase distortion in each of the plurality of gain modes.

The first attenuation circuit may include a first switch and a second switch connected in series between the main input terminal and the input terminal of the variable gain amplifying circuit, a first resistor and a second resistor connected in series between the first switch and the second switch, and a first phase compensating capacitor which is connected between a connection node between the first and second resistors and a ground.

The n-th attenuation circuit may include a first switch and a second switch connected in series between the main input terminal and the input terminal of the variable gain amplifying circuit, a first resistor and a second resistor connected in series between the first switch and the second switch, and an n-th phase compensating capacitor which is connected between a connection node between the first and second resistors and the ground.

The variable gain amplifying circuit may include an amplifying circuit configured to amplify a signal obtained through an input terminal of the variable gain amplifying circuit, and an output load circuit connected between an output terminal of the amplifying circuit and an output terminal of the variable gain amplifying circuit, and configured to vary a resistance value and a capacitance value to control a gain of the amplifying circuit and a return loss at the output terminal of the variable gain amplifying circuit based on the first control signal.

Each of the first to n-th attenuation circuits may include a resistance value that is varied to obtain different attenuation values, and a capacitance value that is varied to obtain different phase compensation values.

At least one of the first to n-th attenuation circuits may be configured to be in an ON state to perform an operation to compensate for an attenuation and phase distortion for a signal obtained through the main input terminal.

In a general aspect, a method includes selecting a gain mode from a plurality of gain modes of a variable gain amplifying circuit in response to a first control signal during operation in an amplification mode, and adjusting an attenuation value and a phase compensation value in a variable attenuation circuit in response to a second control signal to compensate for a phase distortion in the selected gain mode, wherein the adjusting of the attenuation value and the phase compensation value are based on the first control signal and the second control signal.

A signal output from the variable attenuation circuit may be transmitted to an output terminal of the variable attenuation circuit during an operation in a bypass mode in response to a third control signal.

Other features and aspects will be apparent from the following detailed description, the drawings, and the claims.

Figure 1:
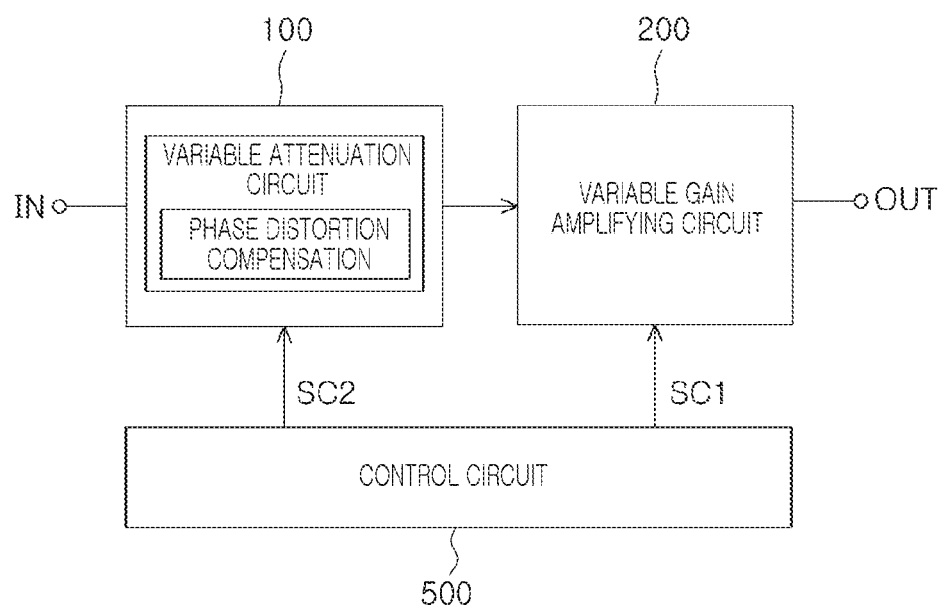
FIG. 1 is a schematic view of an example of a variable gain low noise amplifying apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

In the respective drawings of the present disclosure, unnecessarily overlapped descriptions are possibly omitted for components having the same reference numeral and the same function, and differences in the respective drawings will be described.

Figure 2:
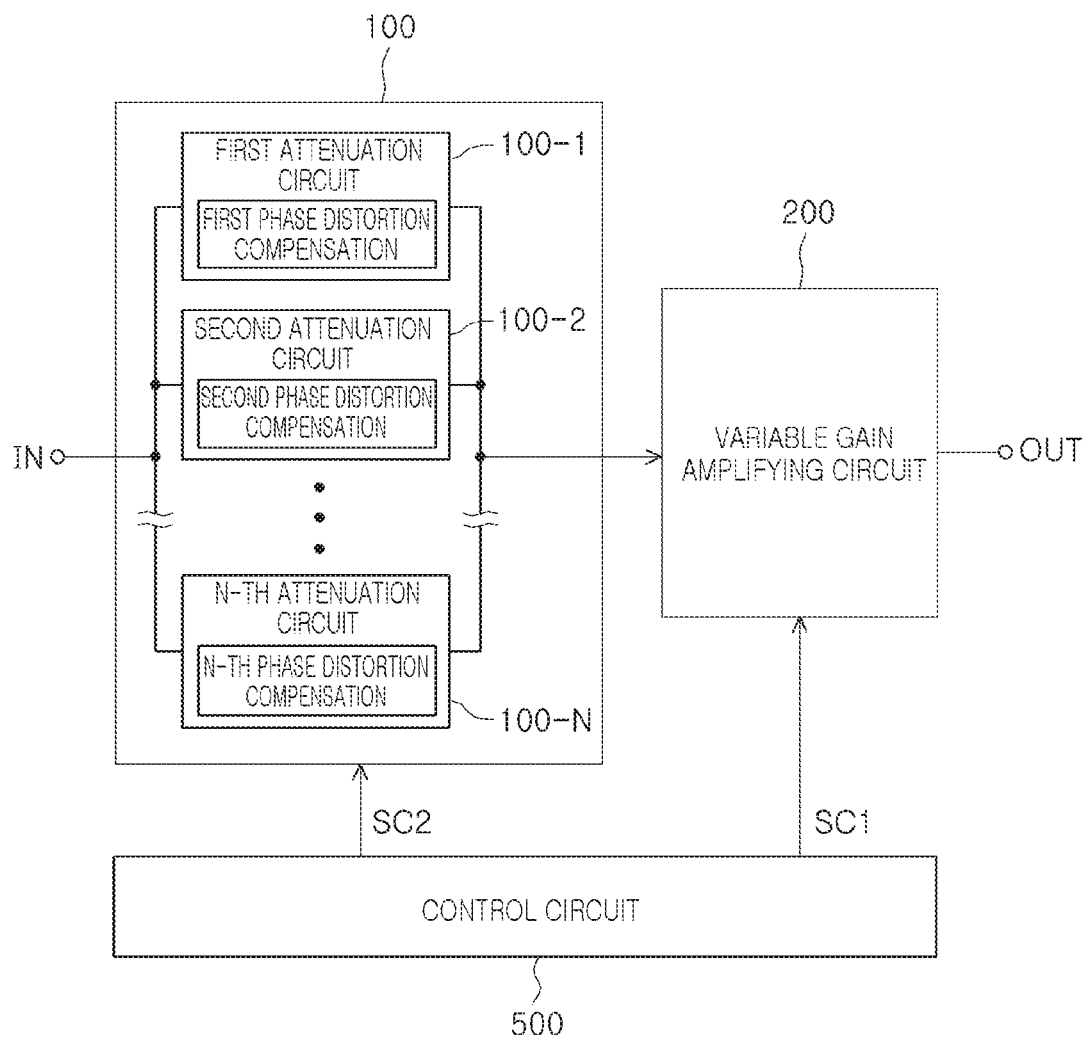
FIG. 2 is a schematic of an example of a variable gain low noise amplifying apparatus.

FIG. 1 is a schematic view of an example of a variable gain low noise amplifying apparatus, and FIG. 2 is a schematic of another example of the variable gain low noise amplifying apparatus. In addition, FIG. 3 is a schematic of another example of the variable gain low noise amplifying apparatus.

Figure 3:
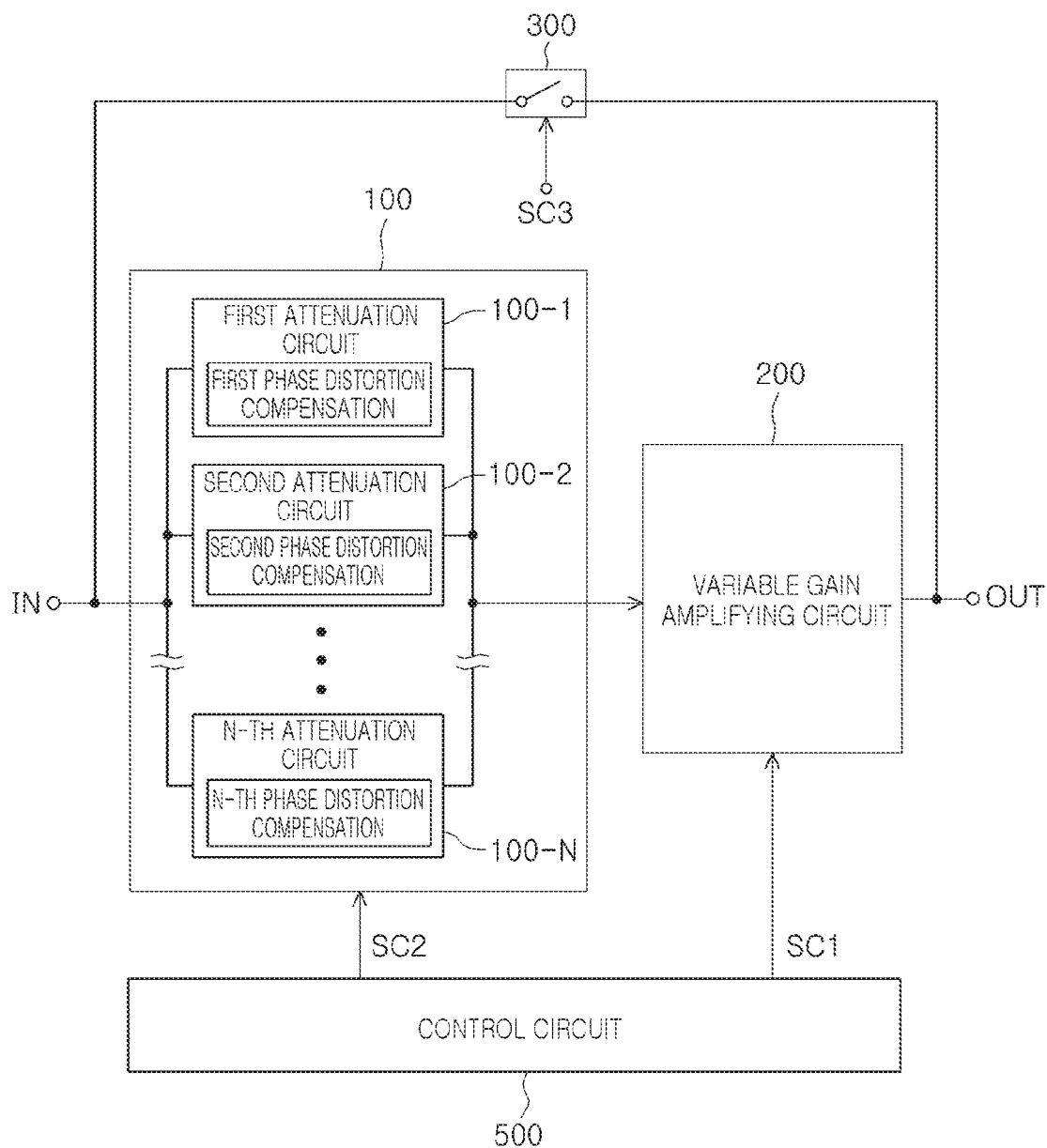
FIG. 3 is a schematic of an example of a variable gain low noise amplifying apparatus.

Referring to FIGS. 1, 2, and 3, an example of a variable gain low noise amplifying apparatus may include a variable attenuation circuit 100, a variable gain amplifying circuit 200, and a control circuit 500.

The variable gain amplifying circuit 200 may operate in one gain mode selected from a plurality of gain modes according to a first control signal SC1.

The variable attenuation circuit 100 may be connected to a main input terminal IN and an input terminal of the variable gain amplifying circuit 200. The variable attenuation circuit 100 may have an attenuation value adjusted according to a second control signal SC2 and a phase compensation value for compensating for phase distortion in the selected gain mode, in conjunction with the selection of the gain mode, provide the attenuation value and phase compensation value corresponding to each gain mode, and compensate for the phase distortion in the corresponding gain mode selected from the plurality of gain modes.

In an example, the control circuit 500 may control the selection of the gain mode of the variable gain amplifying circuit 200, and the attenuation value and the phase compensation value of the variable attenuation circuit 100, based on the first control signal SC1 for selecting one of the plurality of gain modes, and the second control signal SC2.

Referring to FIG. 2, the variable attenuation circuit 100 may include first to n-th attenuation circuits 100-1 to 100-$n$ connected in parallel between the input terminal IN and the input terminal of the variable gain amplifying circuit 200.

Each of the first to n-th attenuation circuits 100-1 to 100-$n$ may have each of first to n-th phase compensation values to compensate for the phase distortion in each gain mode.

In addition, each of the first to n-th attenuation circuits 100-1 to 100-$n$ may include a resistance value varied to determine the attenuation value of a signal based on each of the plurality of gain modes during an operation in the amplification mode.

In an example, the variable attenuation circuit 100 may be implemented so that the plurality of gain modes of the variable gain amplifying circuit 200 and the first to n-th attenuation circuits 100-1 to 100-$n$ correspond to each other at a ratio of 1:1. The implementation of the variable attenuation circuit 100 is not limited thereto. For example, the variable attenuation circuit 100 may be implemented so that the plurality of gain modes of the variable gain amplifying circuit 200 and the first to n-th attenuation circuits 100-1 to 100-$n$ correspond to each other at a ratio of 1:k or k:1. In an example, k is a natural number greater than or equal to 2.

As described above, the variable gain low noise amplifying apparatus may implement various and wide amplification gains by varying an attenuation rate (an attenuation value) in the variable attenuation circuit while varying the plurality of amplification gain modes based on the gain amplifying circuit 200, which is an amplifying core circuit. By previously performing an inverse phase-distortion for the phase distortion caused by the variation of the amplification gain with respect to the phase distortion in the gain mode selected by the variable attenuation circuit, the phase distortion that may be caused in the selected gain mode may be compensated.

Hereinafter, in an example, first to fourth gain modes will be described, but are merely examples for describing the concept of the present disclosure and the present disclosure is not limited thereto.

Referring to FIG. 3, the variable gain low noise amplifying apparatus according to an example may further include a bypass circuit 300.

The bypass circuit 300 may be connected in parallel with the variable attenuation circuit 100 and the variable gain amplifying circuit 200 between the input terminal IN of the variable attenuation circuit 100 and output terminal OUT of the variable gain amplifying circuit 200, and may be in an ON state at the time of a bypass mode that does not require amplification according to a third control signal SC3 to thereby transmit a signal input through the input terminal IN to an output terminal of the variable gain amplifying circuit 200.

Since the bypass mode does not require amplification of the signal and attenuation of the signal, the variable gain amplification circuit 200 and the variable attenuation circuit 100 may be in an OFF state.

Figure 4:
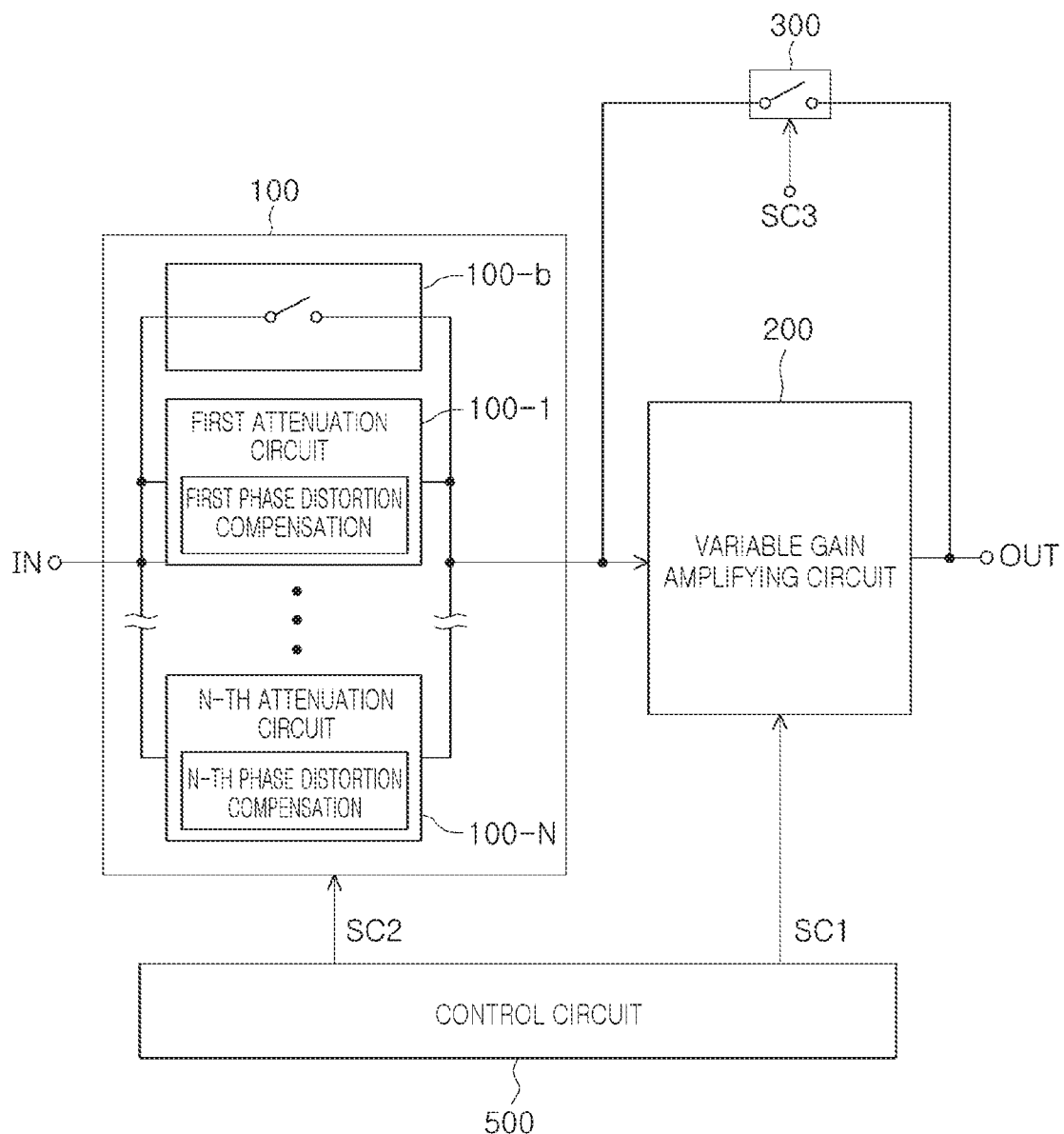
FIG. 4 is a schematic of a variable gain low noise amplifying apparatus.

FIG. 4 is a schematic of an example of the variable gain low noise amplifying apparatus.

Referring to FIG. 4, the variable gain low noise amplifying apparatus may include the variable attenuation circuit 100, the variable gain amplifying circuit 200, and the bypass circuit 300, as non-limiting examples.

The variable gain amplifying circuit 200 may operate in one gain mode selected from a plurality of gain modes during operation of the variable gain low noise amplifying apparatus in an amplification mode according to a first control signal SC1.

The variable attenuation circuit 100 may be connected to the main input terminal IN and the input terminal of the variable gain amplifying circuit 200, and may have an attenuation value adjusted according to the second control signal SC2, and a phase compensation value for compensating for the phase distortion in the selected gain mode, in conjunction with the selection of the gain mode. As an example, the attenuation value may be determined by a resistance value and the phase compensation value may be determined by a capacitance value.

The bypass circuit 300 may be connected in parallel with the variable gain amplifying circuit 200 and may be in an ON state during an operation in the bypass mode, which does not require amplification according to the third control signal SC3 to thereby transmit a signal output from the variable attenuation circuit 100 to an output terminal of the variable gain amplifying circuit 200. As an example, the bypass circuit 300 may operate in an ON state or an OFF state complementarily to the variable gain amplifying circuit 200.

Since the bypass mode may not require amplification of the signal and attenuation of the signal, the variable attenuation circuit 100 may be in the OFF state.

In addition, the variable attenuation circuit 100 may include an attenuation bypass circuit 100-b which is in the ON state during operation in the bypass mode, and first to n-th attenuation circuits 100-1 to 100-n connected to the attenuation bypass circuit 100-b in parallel and are selectively in the ON state during operation in the amplification mode.

Each of the first to n-th attenuation circuits 100-1 to 100-n may compensate for phase distortion in the corresponding gain mode selected from the plurality of gain modes based on the phase compensation value determined according to the second control signal SC2.

In addition, the control circuit 500 may control the bypass circuit 300 based on the third control signal SC3. As an example, the control circuit may control the bypass circuit 300 in the ON state at the time of the bypass mode and control the bypass circuit 300 in the OFF state at the time of the amplification mode.

Figure 5:
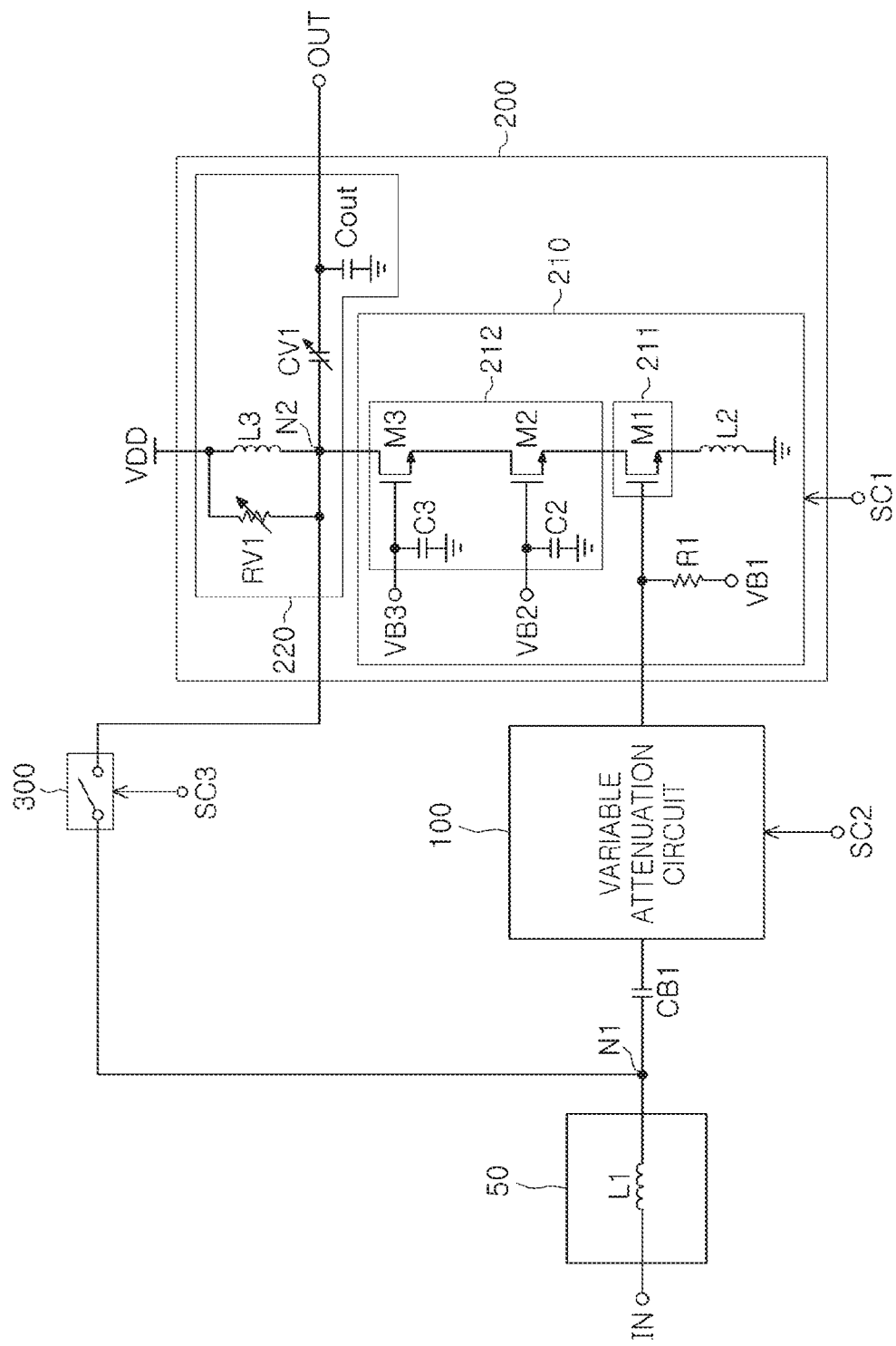
FIG. 5 illustrates an example of a circuit diagram of the variable gain low noise amplifying apparatus of FIG. 3.
Figure 6:
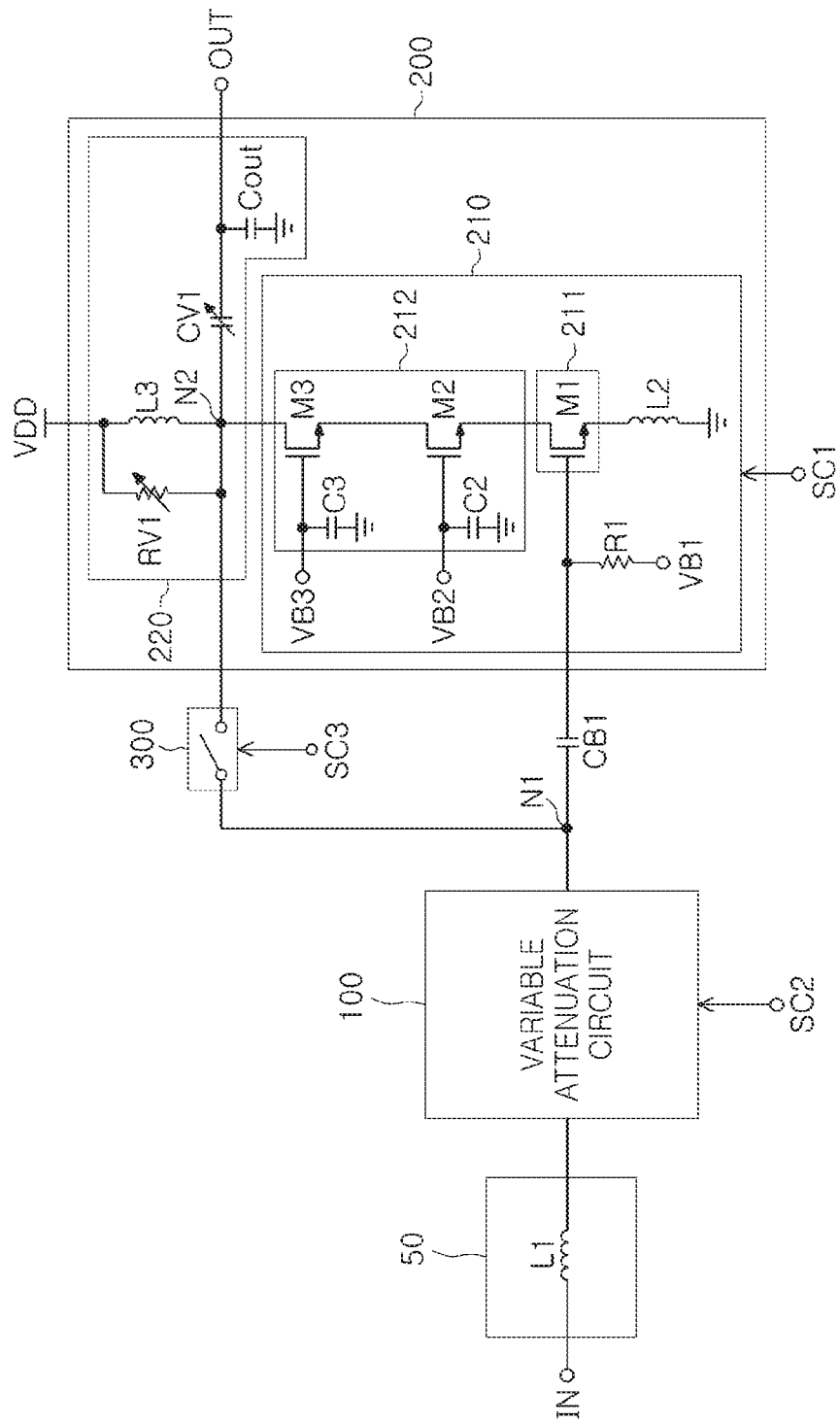
FIG. 6 illustrates an example of a circuit diagram of the variable gain low noise amplifying apparatus of FIG. 4.

FIG. 5 illustrates an example of a circuit diagram of the variable gain low noise amplifying apparatus of FIG. 3 and FIG. 6 illustrates an example of a circuit diagram of the variable gain low noise amplifying apparatus of FIG. 4.

Referring to FIGS. 5 and 6, the variable gain amplification circuit 200 may include an amplifying circuit 210 and an output load circuit 220.

The amplifying circuit 210 may amplify a signal input through the input terminal of the variable gain amplifying circuit 200, based on a corresponding gain of a previously selected gain mode.

The output load circuit 220 may be connected between an output node of the amplifying circuit 210 and the output terminal OUT of the low noise amplifying circuit, and a resistance value and a capacitance value of the output load circuit 220 may be adjusted to control a gain of the amplifying circuit 210 and return loss at the output terminal OUT according to the first control signal SC1. As an example, the resistance value of the output load circuit 220 may adjust the gain of the variable gain amplifying circuit 200 and the capacitance value of the output load circuit 220 may adjust output return loss of the variable gain amplifying circuit 200.

Referring to FIGS. 5 and 6, the variable gain low noise amplifying apparatus may include an input matching circuit 50 connected between the input terminal IN and the input terminal of the variable attenuation circuit 100. As an example, the input matching circuit 50 may include a coil L1.

The amplifying circuit 210 may include a common source amplifying circuit 211 and a common gate amplifying circuit 212.

The common source amplifying circuit 211 may include a common source transistor M1 that amplifies the signal input from the variable attenuation circuit 100. As an example, a first bias voltage VB1 terminal connected through a resistor R1 may be connected to a gate of the common source transistor M1. An inductor L2 may be connected between a source of the common source transistor M1 and a ground. A direct current (DC) blocking capacitor CB1 may be connected to an input terminal of the common source amplifying circuit 211. As an example, the inductor L2 may be a degeneration inductor capable of improving linearity.

The common gate amplifying circuit 212 may include first and second common gate transistors M2 and M3 which are cascode-connected to the common source transistor M1 to amplify a signal amplified by the common source amplifying circuit 211.

As an example, a second bias voltage VB2 terminal may be connected to a gate of the first common gate transistor M2 and a capacitor C2 may be connected between the gate of the first common gate transistor M2 and a ground. A source of the first common gate transistor M2 may be connected to a drain of the common source transistor M1 and a drain of the first common gate transistor M2 may be connected to a source of the second common gate transistor M3.

In addition, a third bias voltage VB3 terminal may be connected to a gate of the second common gate transistor M3 and a capacitor C3 may be connected between the gate of the second common gate transistor M3 and a ground. The source of the second common gate transistor M3 may be connected to the drain of the first common gate transistor M2 and a drain of the second common gate transistor M3 may be connected to an output node N2 of the amplifying circuit 210. As an example, the common gate amplifying circuit 212 may have an amplification rate which is 1 or more and is smaller than that of the common source amplifying circuit 211.

The output load circuit 220 may include an inductor L3 connected between a power source voltage VDD terminal and the output node N2 of the amplifying circuit 210, a variable resistor circuit RV1 connected in parallel to the inductor L3, a variable capacitor circuit CV1 connected between the output node N2 of the amplifying circuit 210 and the output terminal OUT of the variable gain low noise amplifying apparatus, and an output capacitor Cout connected between the output terminal OUT and the ground.

The variable resistor circuit RV1 may have a resistance value that is varied according to the first control signal SC1, and may contribute to determining the gain of the variable amplifying circuit 210. The variable capacitor circuit CV1 may have a capacitance value that is varied according to the first control signal SC1, and the return loss may be thus adjusted.

For example, the variable resistor circuit RV1 may be implemented as a circuit that may vary the resistance value according to the first control signal SC1. As an example, the variable resistor circuit RV1 may be a circuit including a plurality of resistors having different resistance values and a plurality of switches for selecting the plurality of resistors. The variable capacitor circuit CV1 may be implemented as a circuit that may vary a capacitance value according to the first control signal SC1. As an example, the variable capacitor circuit CV1 may be a circuit including a plurality of capacitors having different capacitance values and a plurality of switches configured to select the plurality of capacitors.

In an example, referring to FIGS. 5 and 6, in the case in which the variable gain amplifying circuit 200 includes the amplifying circuit 210 and the output load circuit 220, the bypass circuit 300 may be connected to the output node N2 of the amplifying circuit 210, which is a connection node between the amplifying circuit 210 and the output load circuit 220.

In an example, as illustrated in FIG. 5, the bypass circuit 300 may bypass the signal of the input terminal of the variable attenuation circuit 100 to the output node N2 of the amplifying circuit 210. Alternatively, as illustrated in FIG. 6, the bypass circuit 300 may bypass the signal of the output terminal of the variable attenuation circuit 100 to the output node N2 of the amplifying circuit 210.

Even in a case in which the signal is bypassed to the output node N2 of the amplifying circuit 210 by the bypass circuit 300, impedance matching is performed by the output load circuit 220 so that the signal may be transmitted without loss.

The variable attenuation circuit 100 may compensate for phase distortion generated according to the selected gain mode of the amplifying circuit 210. This will be described with reference to FIGS. 7 and 8.

Figure 7:
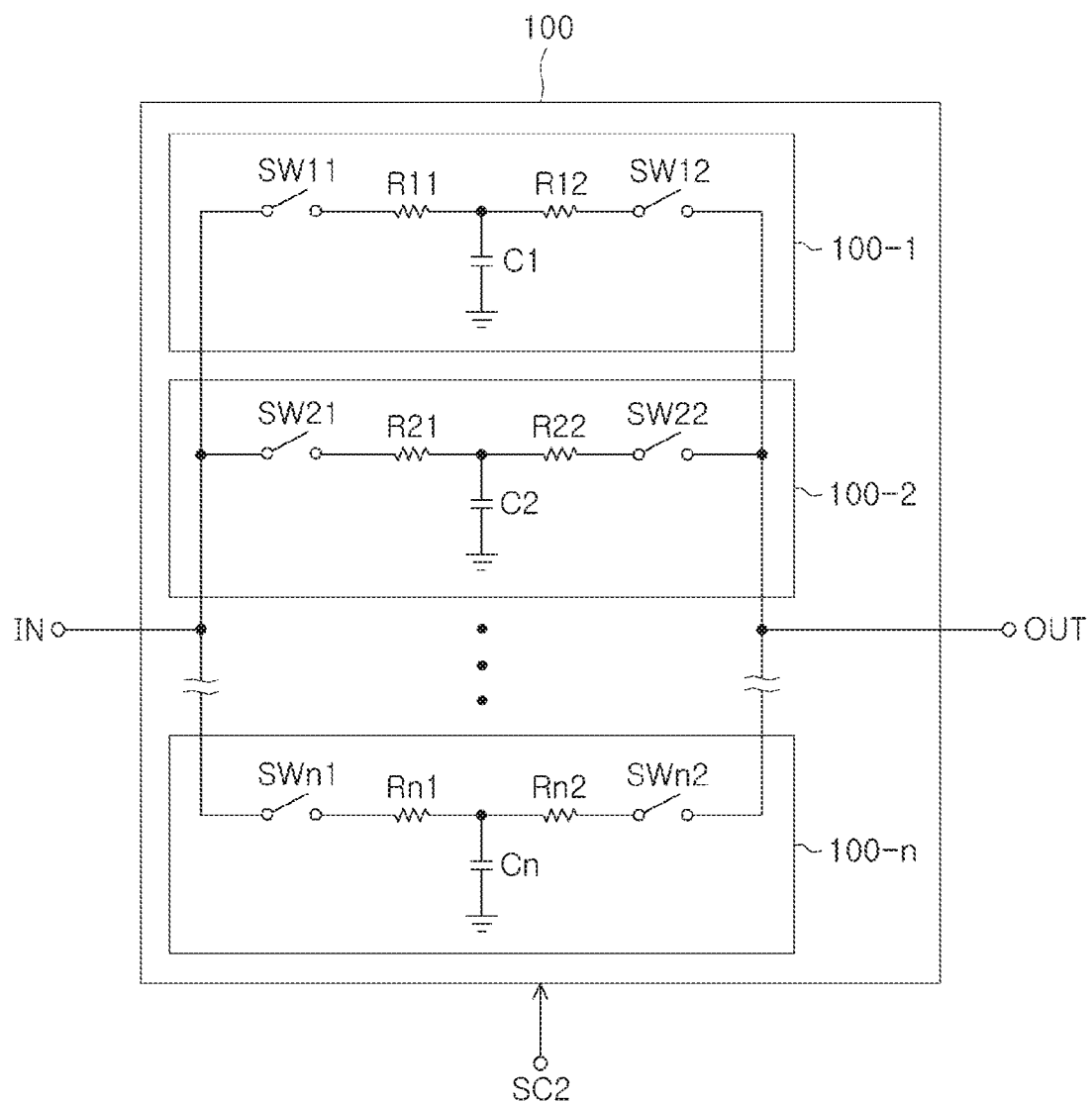
FIG. 7 is a schematic view of an example of a variable attenuation circuit of FIGS. 3 and 5.

FIG. 7 is a schematic view of an example of a variable attenuation circuit of FIGS. 3 and 5.

Referring to FIGS. 3, 5, and 7, the variable attenuation circuit 100 may include first to n-th attenuation circuits 100-1 to 100-n (n is a natural number greater than or equal to 2) connected in parallel between the main input terminal IN and the input terminal of the variable gain amplifying circuit 200, as illustrated in FIG. 2.

The first attenuation circuit 100-1 may include first and second switches SW11 and SW12 connected in series between the input terminal IN and the input terminal of the variable gain amplifying circuit 200, first and second resistors R11 and R12 connected in series between the first switch S11 and the second switch SW12, and a first phase compensating capacitor C1 connected between a connection node between the first and second resistors R11 and R12 and the ground.

The n-th attenuation circuit 100-n (n is a natural number greater than or equal to 2) may include first and second switches SWn1 and SWn2 connected in series between the input terminal IN and the input terminal of the variable gain amplifying circuit 200, first and second resistors Rn1 and Rn2 connected in series between the first switch SWn1 and the second switch SWn2, and a n-th phase compensating capacitor Cn connected between a connection node between the first and second resistors Rn1 and Rn2 and the ground.

For example, referring to FIGS. 3 and 5, the variable attenuation circuit 100 may be in an ON state in an example of the bypass mode operation, and may be in an OFF state in an example of the amplification mode operation.

As an example, in the amplification mode, in order to compensate for the signal attenuation and the phase distortion corresponding to each of the plurality of gain modes, each of the first to n-th attenuation circuits 100-1 to 100-n may include a resistance value that is varied to obtain different attenuation values and a capacitance value that is varied to obtain different phase compensation values.

In addition, in the example of the amplification mode, at least one of the first to n-th attenuation circuits 100-1 to 100-n may be in the ON state to perform an operation to compensate for the attenuation of the signal through the input terminal IN and the phase distortion.

Figure 8:
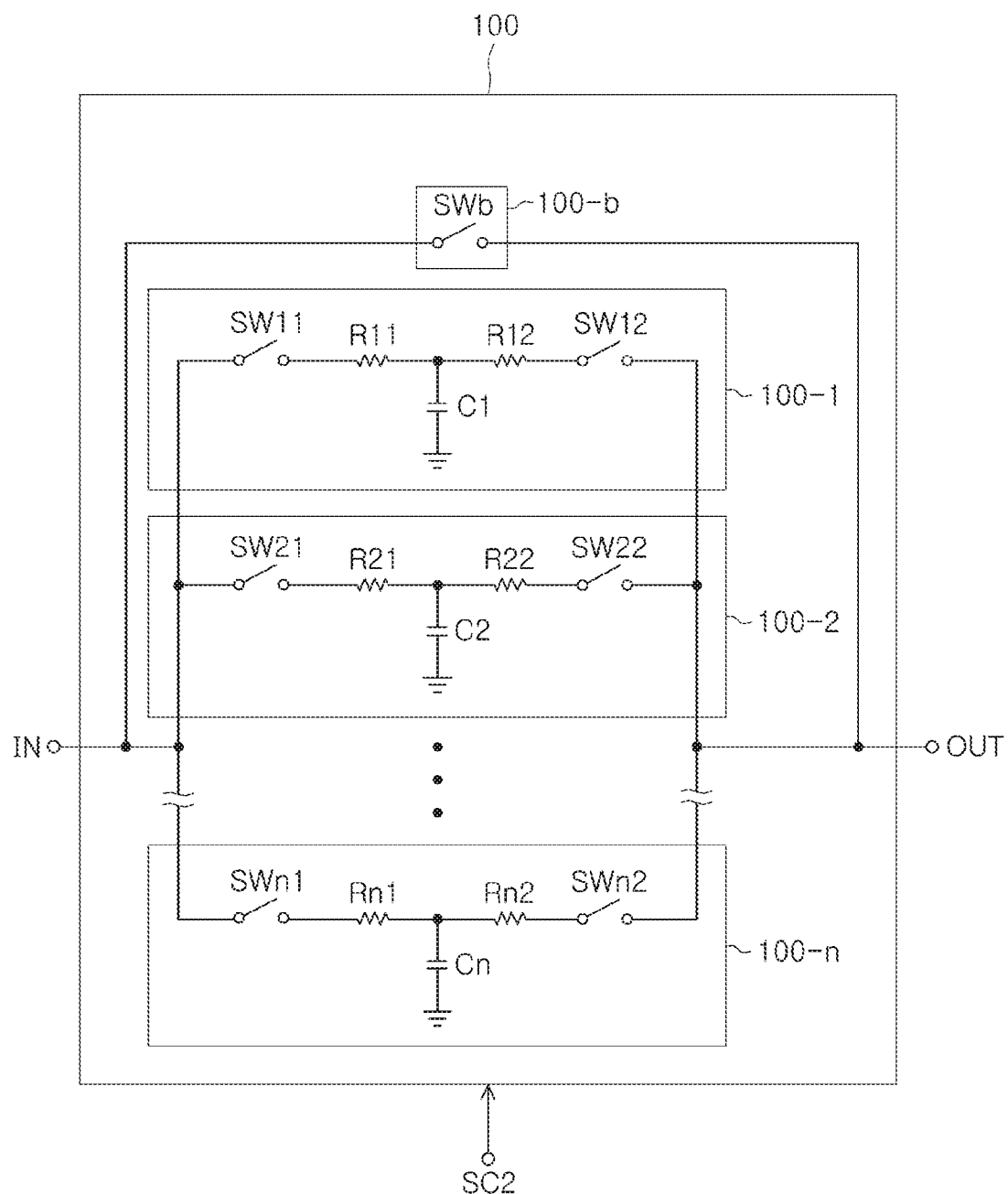
FIG. 8 is a schematic of an example of a variable attenuation circuit of FIGS. 4 and 6.

FIG. 8 is a schematic of an example of a variable attenuation circuit of FIGS. 4 and 6.

Referring to FIGS. 4, 6, and 8, the variable attenuation circuit 100 may include an attenuation bypass circuit 100-b which is in the ON state during operation in the bypass mode, and first to n-th attenuation circuits 100-1 to 100-n which may be connected in parallel to the attenuation bypass circuit 100-b, and may be selectively in the ON state at the time of the operation in the amplification mode.

The attenuation bypass circuit 100-b may include a bypass switch SW-b which may be in the ON state during operation in the bypass mode, and may be in the OFF state during operation in the amplification mode.

The first attenuation circuit 100-1 may include first and second switches SW11 and SW12 which may be in the OFF state during operation in the bypass mode, and may be in the ON state during operation in the amplification mode, and may be connected in series between the main input terminal IN and the input terminal of the variable gain amplifying circuit 200. The first attenuation circuit 100-1 may also include first and second resistors R11 and R12 connected in series between the first and second switches SW11 and SW12, and a first phase compensating capacitor C1 connected between a connection node between the first and second resistors R11 and R12 and the ground.

The n-th attenuation circuit 100-n may include first and second switches SWn1 and SWn12 which may be in the OFF state during operation in the bypass mode, be in the ON state during operation in the amplification mode, and may be connected in series between the input terminal IN and the input terminal of the variable gain amplifying circuit 200. The n-th attenuation circuit 100-n may also include first and second resistors Rn1 and Rn2 connected in series between the first and second switches SWn1 and SWn2, and a n-th phase compensating capacitor Cn connected between a connection node between the first and second resistors Rn1 and Rn2 and the ground.

As an example, in the case of the amplification, in order to compensate for the signal attenuation and the phase distortion corresponding to each of the plurality of gain modes, each of the first to n-th attenuation circuits 100-1 to 100-n may include a resistance value that is varied to obtain different attenuation values and a capacitance value that is varied to obtain different phase compensation values.

In addition, in the example of an operation in the amplification mode, at least one of the first to n-th attenuation circuits 100-1 to 100-n may be in the ON state to perform an operation for compensating for the attenuation of the signal through the input terminal IN and the phase distortion.

For example, referring to FIGS. 7 and 8, the variable attenuation circuit 100 may include a number of variable attenuation circuits corresponding to the number of the plurality of gain modes. As an example, in a case in which the variable gain amplifying circuit 200 operates in two gain modes during operation in the amplification mode, the variable attenuation circuit 100 may include first and second attenuation circuits 100-1 and 100-2. As another example, in an example in which the variable gain amplifying circuit 200 operates in n gain modes during an operation in the amplification mode, the variable attenuation circuit 100 may include first to n-th attenuation circuits 100-1 to 100-n.

During an operation in the amplification mode, one of the first to n-th attenuation circuits 100-1 to 100-n may be in the ON state to provide a resistance value for providing an attenuation value corresponding to a corresponding gain.

Each of the first to n-th attenuation circuit 100-1 to 100-n may include first to n-th resistance values which are different from each other so as to correspond to the first to n-th gain modes, and the first to n-th phase compensating capacitors C1 and C2 to Cn may also be set to have first to n-th capacitance values which are different from each other so as to correspond to the first to n-th gain modes. Accordingly, the phase distortion generated according to each of the first to n-th gain modes may be appropriately compensated. This will be described with reference to FIGS. 14 and 15.

Each of the first to n-th variable attenuation circuits 100-1 to 100-n may be configured as described above, but are not limited thereto, and may include at least one switch, at least one resistor, and at least one capacitor.

For example, the plurality of gain modes that are selectable during an operation in the amplification mode may include a first gain mode (GM1) (e.g., 19 dB), a second gain mode (GM2) (e.g., 15 dB), a third gain mode (GM3) (e.g., 9 dB), and a fourth gain mode (GM4) (e.g., 3 dB) which operate with different levels of gains. In the example of operating in the bypass mode, the variable gain low noise amplifying apparatus may operate in one of a total five operation modes including the first to fourth gain modes that are selectable during operations in the amplification mode and the bypass mode. This will be described with reference to FIGS. 9 through 13.

As described above, in the various examples, an appropriate gain mode may be selected from the plurality of gain modes of the amplification mode while the amplification mode is performed. Accordingly, when the amplification gain is varied, the return loss corresponding to the amplification gain may be varied, and as such amplification gain and return loss are varied, the phase distortion may be generated. However, the variable attenuation circuit according to the examples may compensate for the phase distortion due to the variable gain amplifying circuit 200. That is, the variable attenuation circuit may previously perform a phase compensation for offsetting the phase distortion to offset the phase distortion due to the variable gain amplifying circuit 200. As a result, the phase distortion may be compensated.

Figure 9:
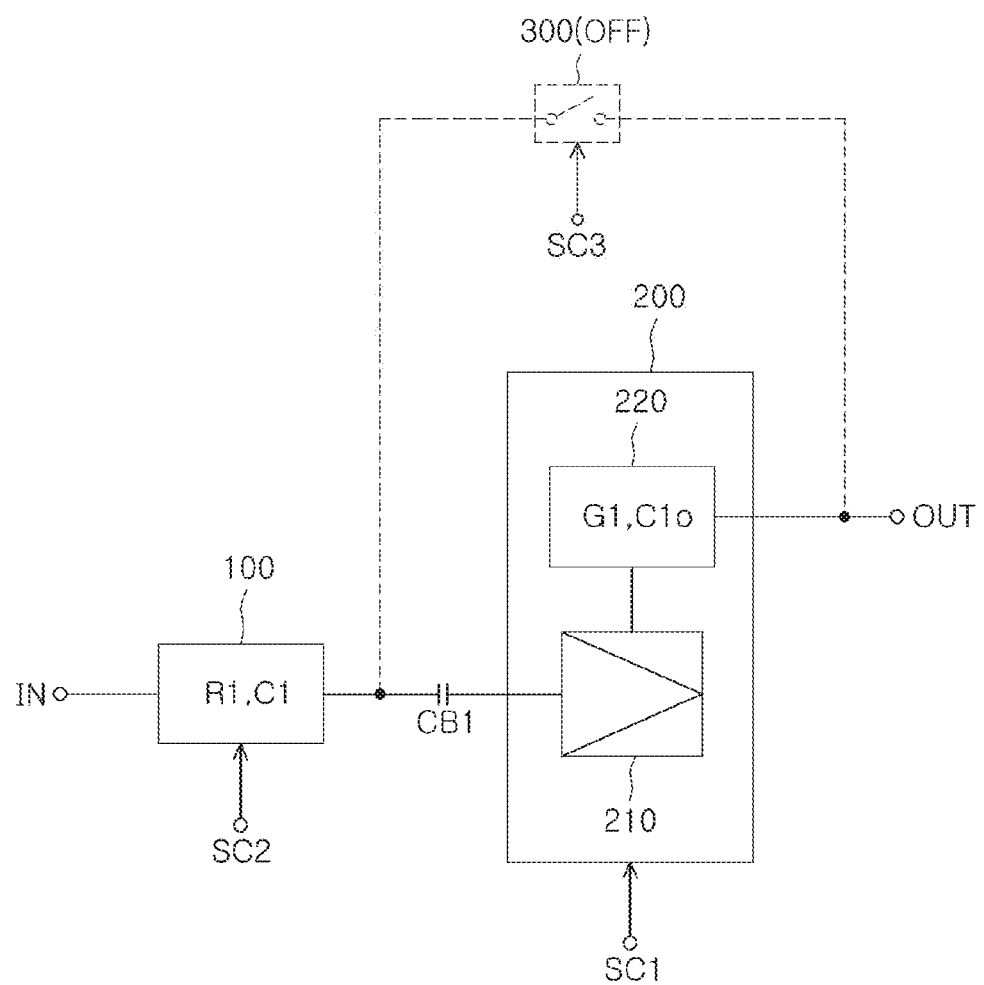
FIG. 9 is a view illustrating an example of an operation in a first gain mode (GM1) of the variable gain low noise amplifying apparatus of FIG. 6.

FIG. 9 is a view illustrating an example of an operation in a first gain mode (GM1) of the variable gain low noise amplifying apparatus of FIG. 6.

FIG. 9 is a view showing an example of an operational state of the variable gain low noise amplifying apparatus when the variable gain low noise amplifying apparatus of FIG. 6 is in a high gain mode, which is the first gain mode (GM1), wherein in the first gain mode (GM1), the bypass circuit 300 may be in the OFF state.

In addition, in the first gain mode (GM1), the output load circuit 220 may include a first gain G1 and a first output capacitance C1o determined by each of the variable resistor circuit RV1 and the variable capacitor circuit CV1 that are varied according to the first control signal SC1. In addition, the variable attenuation circuit 100 may include a first attenuation value R1 and a first phase compensation value C1 determined according to the second control signal SC2.

At this time, in the case of the first gain mode (GM1), referring to FIG. 6, when the variable resistance circuit RV1 may be a switched variable resistor circuit, if all of the internal switches are turned off to become high impedance (ideally, infinite impedance), it may not affect impedance of the inductor L3.

Figure 10:
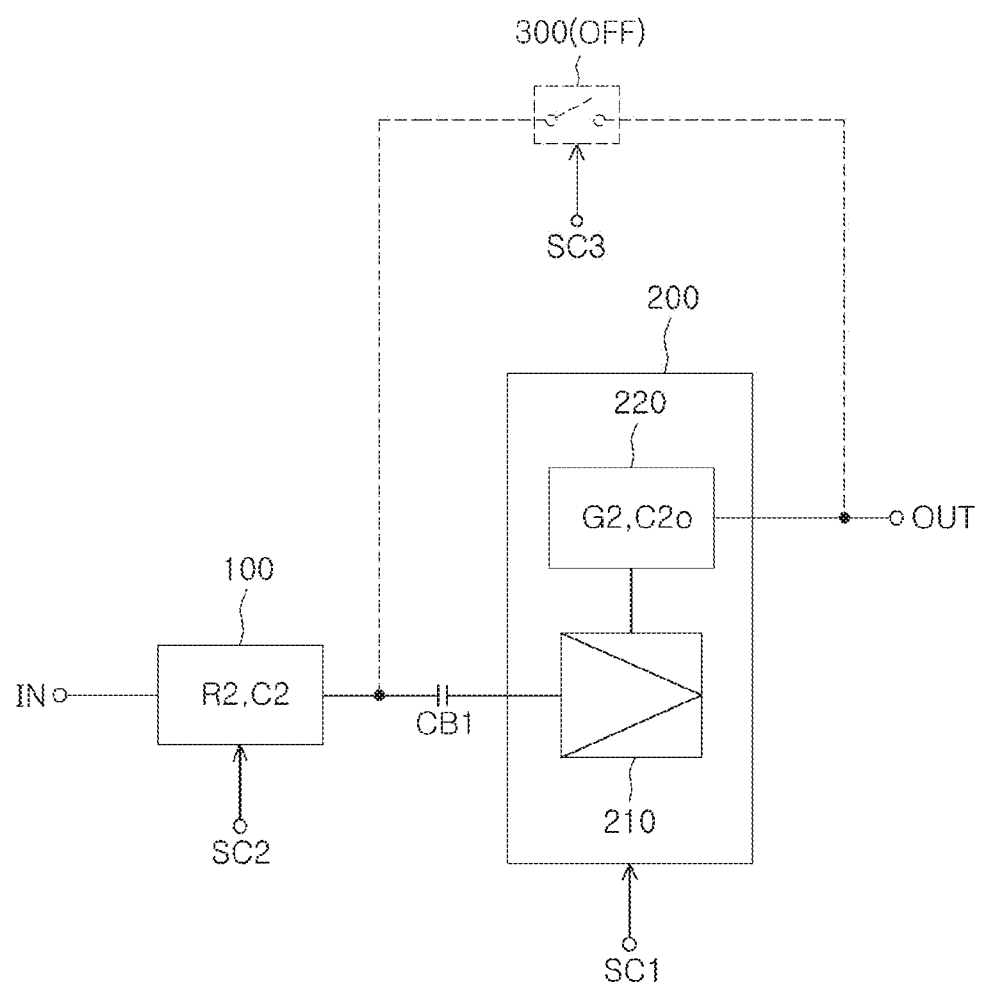
FIG. 10 is a view illustrating an example of an operation in a second gain mode (GM2) of the variable gain low noise amplifying apparatus of FIG. 6.

FIG. 10 is a view illustrating an example of an operation in a second gain mode (GM2) of the variable gain low noise amplifying apparatus of FIG. 6.

FIG. 10 is a view illustrating an example of an operation state of the variable gain low noise amplifying apparatus when the variable gain low noise amplifying apparatus of FIG. 6 is in a second high gain mode, which is the second gain mode (GM2), wherein in the second gain mode (GM2), the bypass circuit 300 may be in the OFF state.

In addition, in the second gain mode (GM2), the output load circuit 220 may include a second gain G2 and a second output capacitance C2o determined by each of the variable resistor circuit RV1 and the variable capacitor circuit CV1 varied according to the first control signal SC1. In addition, the variable attenuation circuit 100 may include a second attenuation value R2 and a second phase compensation value C2 determined according to the second control signal SC2.

In the high gain mode, which is the first and second gain modes as described above, a noise figure may be a more important factor than linearity. Therefore, the impedance of the variable attenuation circuit and the impedance of the bypass circuit may be set to be greater than the input impedance of a low noise amplifier (LNA), such that the noise figure (NF) of the LNA circuit may be improved, isolation of the entire circuit may be secured, and a stable operation may be performed.

Referring to FIGS. 9 and 10, when the variable gain low noise amplifying apparatus is in the first and second high gain modes, respectively, which are the first and second gain modes (GM1) and (GM2), the first variable attenuation circuit 100-1 and the second variable attenuation circuit 100-2 of the variable attenuation circuit 100 may secure a higher gain and a high noise figure while operating in the first and second high gain modes, respectively.

Figure 11:
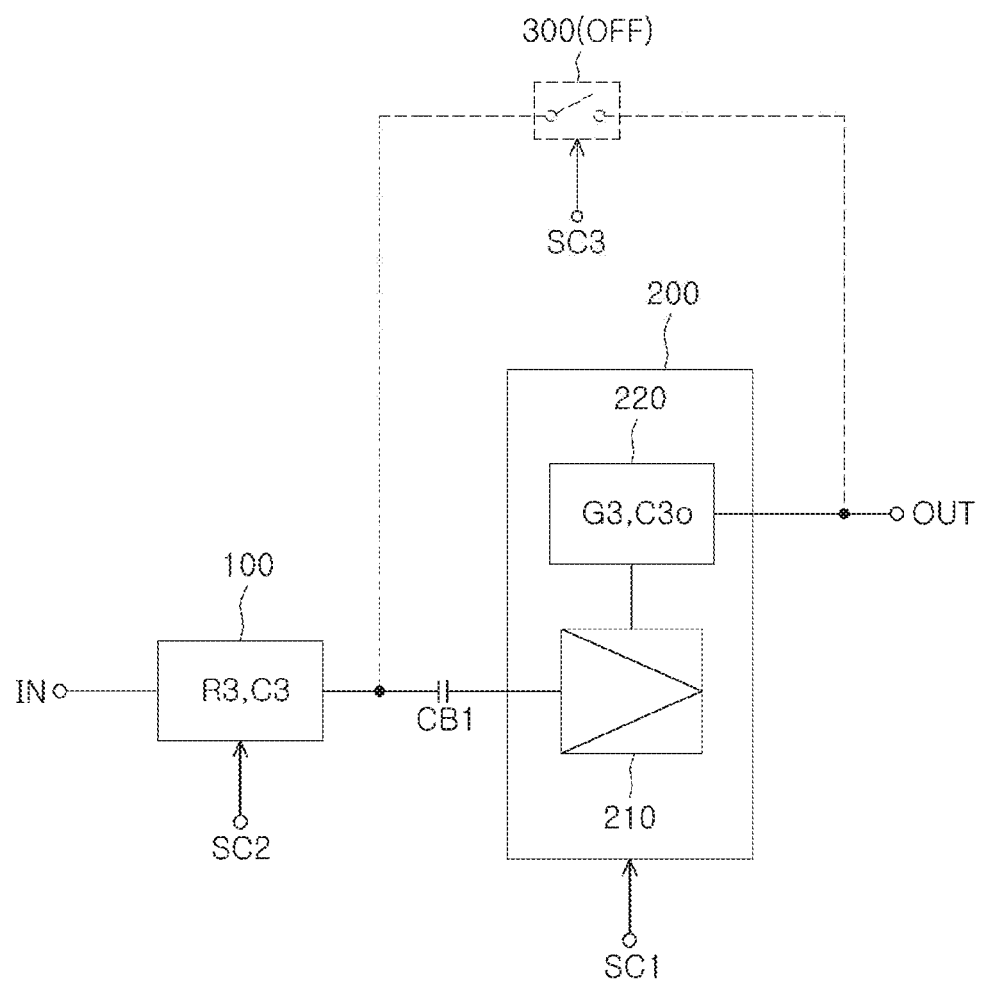
FIG. 11 is a view illustrating an example of an operation in a third gain mode (GM3) of the variable gain low noise amplifying apparatus of FIG. 6.

FIG. 11 is a view illustrating an example of an operation in a third gain mode (GM3) of the variable gain low noise amplifying apparatus of FIG. 6.

FIG. 11 is a view illustrating an example of an operation state of the variable gain low noise amplifying apparatus when the variable gain low noise amplifying apparatus of FIG. 6 is in a first low gain mode, which is the third gain mode (GM3), wherein in the third gain mode (GM3), the bypass circuit 300 may be in the OFF state.

In addition, in the third gain mode (GM3), the output load circuit 220 may include a third gain G3 and a third output capacitance C3o determined by each of the variable resistor circuit RV1 and the variable capacitor circuit CV1 which are varied according to the first control signal SC1. In addition, the variable attenuation circuit 100 may include a third attenuation value R3 and a third phase compensation value C3 determined according to the second control signal SC2.

Figure 12:
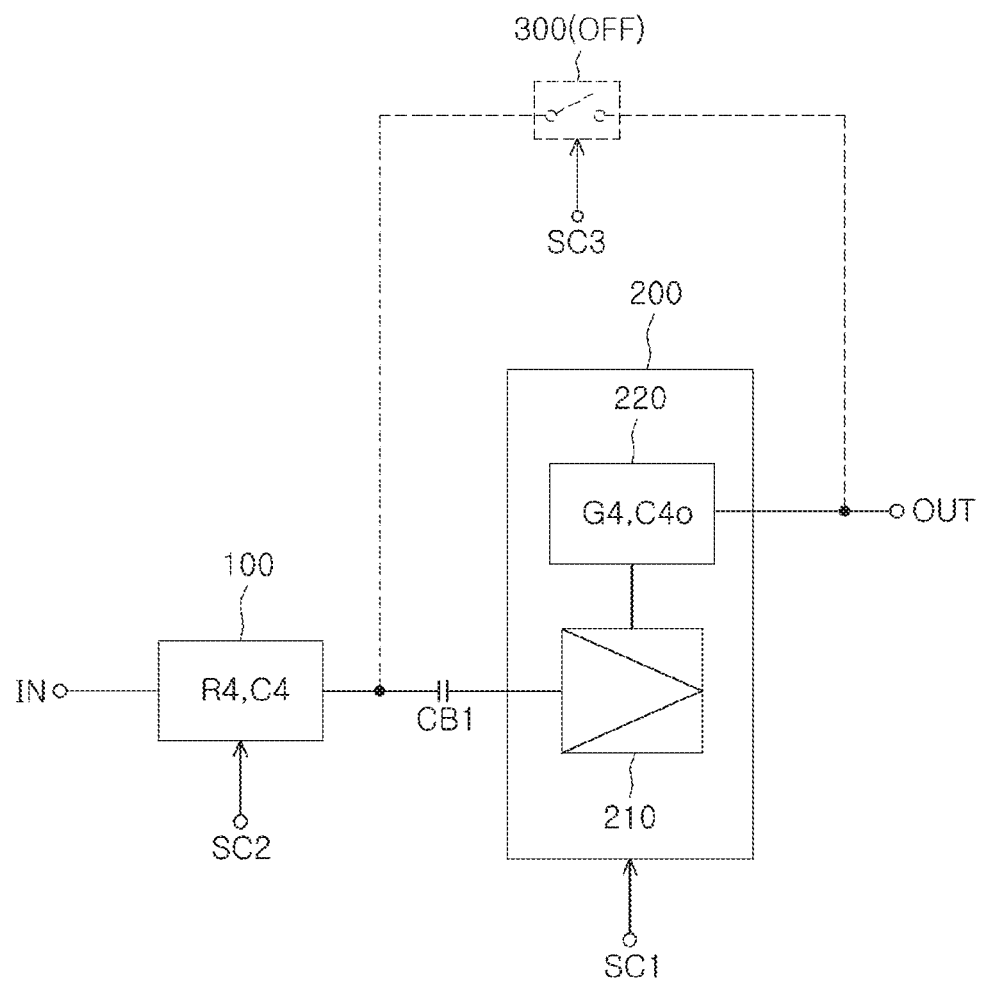
FIG. 12 is a view illustrating an example of an operation in a fourth gain mode (GM4) of the variable gain low noise amplifying apparatus of FIG. 6.

FIG. 12 is a view illustrating an example of an operation in a fourth gain mode (GM4) of the variable gain low noise amplifying apparatus of FIG. 6.

FIG. 12 is a view illustrating an example of an operation state of the variable gain low noise amplifying apparatus when the variable gain low noise amplifying apparatus of FIG. 6 is in a second low gain mode, which is the fourth gain mode (GM4), wherein in the fourth gain mode (GM4), the bypass circuit 300 may be in the OFF state.

In addition, in the fourth gain mode (GM4), the output load circuit 220 may include a fourth gain G4 and a fourth output capacitance C4o determined by each of the variable resistor circuit RV1 and the variable capacitor circuit CV1 which are varied according to the first control signal SC1. In addition, the variable attenuation circuit 100 may include a fourth attenuation value R4 and a fourth phase compensation value C4 determined according to the second control signal SC2.

Referring to FIGS. 11 and 12, when the variable gain low noise amplifying apparatus is in the first and second low gain modes, respectively, which are the third and fourth gain modes (GM3 and GM4), the third variable attenuation circuit 100-3 and the fourth variable attenuation circuit 100-4 of the variable attenuation circuit 100 may secure a higher gain and high linearity while operating in the third and fourth high gain modes, respectively.

Figure 13:
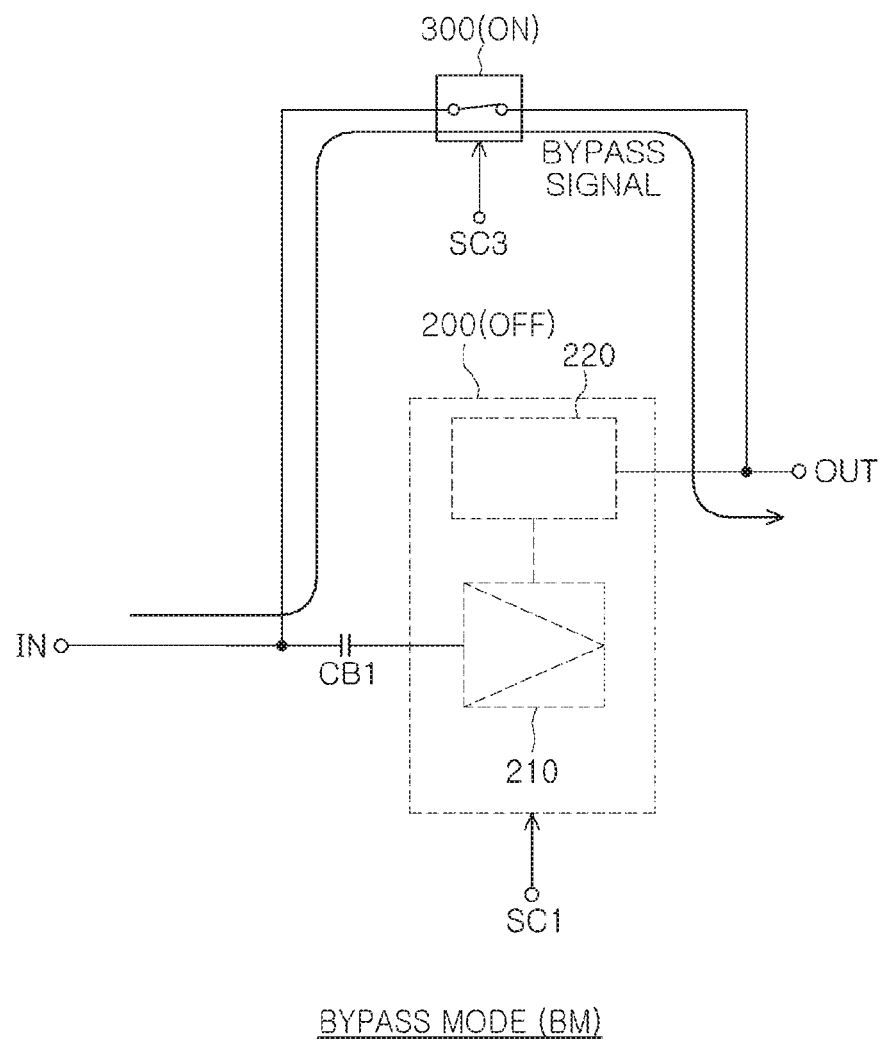
FIG. 13 is a view illustrating an example of an operation in a bypass mode of the variable gain low noise amplifying apparatus of FIG. 6.

FIG. 13 is a view illustrating an example of an operation in a bypass mode of the variable gain low noise amplifying apparatus of FIG. 6.

Referring to FIG. 13, when the variable gain low noise amplifying apparatus of FIG. 6 is in the bypass mode, the bypass circuit 300 may be in the ON state, the operation of the variable gain amplifying circuit 200 may be turned off, and the attenuation bypass circuit 100-b of the variable attenuation circuit 100 may be in the ON state.

At this time, the signal input through the main input terminal IN may pass through the attenuation bypass circuit 100-b of the variable attenuation circuit 100 and may then be transmitted to the output terminal OUT through the bypass circuit 300 without amplification.

Figure 14:
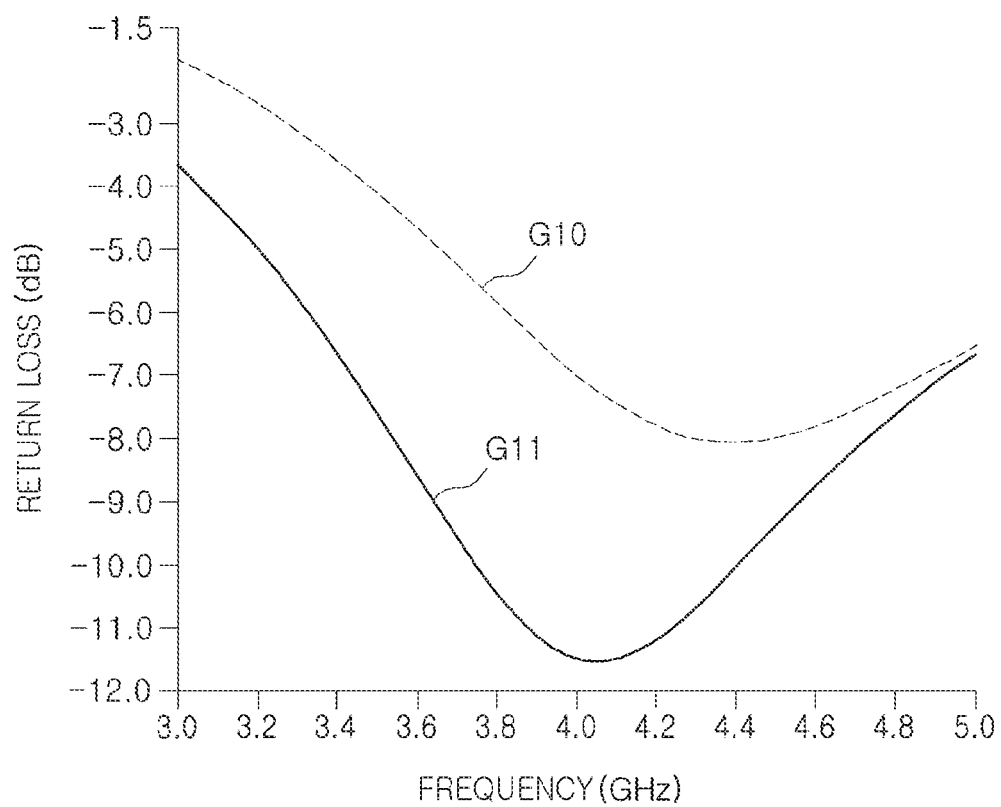
FIG. 14 is a graph illustrating an example of phase discontinuity due to a gain variation when a phase compensation is not applied.

FIG. 14 is a graph illustrating an example of return loss for an example in which a return loss compensation according to the present disclosure is applied.

Graph G10 illustrated in FIG. 14 is a graph illustrating an example of output return loss for an example in which the return loss compensation is not applied, and G11 is a graph illustrating an example of the return loss for an example in which the return loss compensation is applied.

Graph G11 is a graph for an example in which the low noise amplifying apparatus operates in a mode in which the attenuation of the variable attenuation circuit 100 is 2 dB, an overall gain is set to 9 dB by adjusting the variable resistor circuit RV1 of the output load circuit 220, and the capacitance of the variable capacitor circuit CV1 is tuned to a preset value for the corresponding gain mode to compensate for the output return loss of the output load circuit 220.

Referring to graphs G10 and G11 of FIG. 14, it may be seen that the output return loss is improved.

Figure 15A:
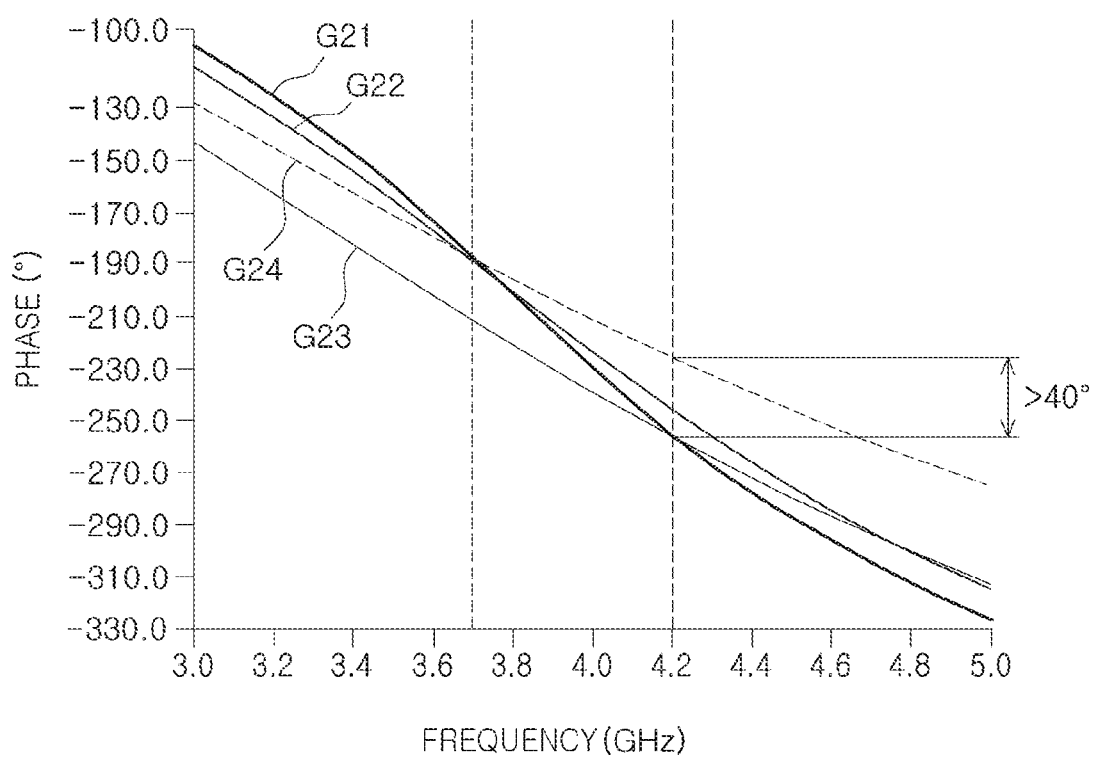
FIG. 15A is a graph illustrating an example of phase discontinuity due to a gain variation when a phase compensation is not applied.
Figure 15B:
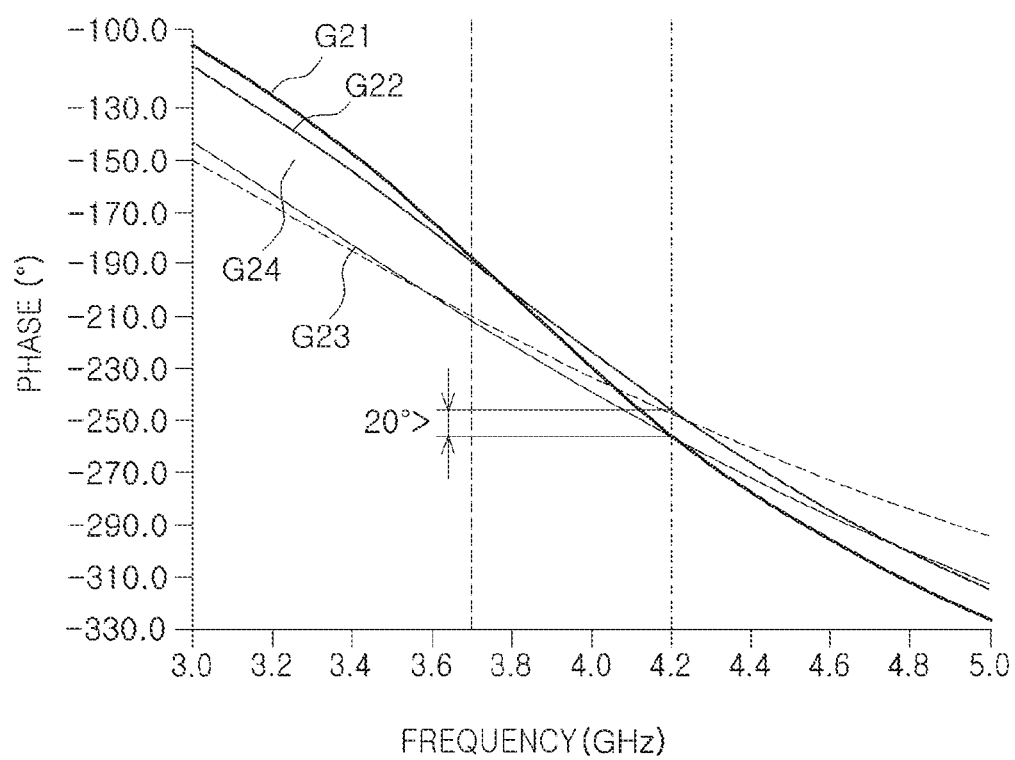
FIG. 15B is a graph illustrating an example of phase discontinuity due to a gain variation when a phase compensation is applied.

FIG. 15A is an example of a graph illustrating phase discontinuity due to a gain variation when a phase compensation according to the present disclosure is not applied and FIG. 15B is an example of a graph illustrating phase discontinuity due to a gain variation when a phase compensation according to the present disclosure is applied.

FIGS. 15A and 15B are graphs showing a change in phase according to a change in gain in a wideband of 3.7 GHz to 4.2 GHz, and graphs G21, G22, G23, and G24 of FIG. 15A are graphs showing a gain-phase relationship in different gain modes for the low noise amplifying apparatus in the example in which the phase compensation is not applied.

Graphs G31, G32, G33, and G34 of FIG. 15B are graphs showing a gain-phase relationship in different gain modes for the low noise amplifying apparatus in the example in which the phase compensation is applied.

Comparing the graph of G21 with the graph of G24 illustrated in FIG. 15A, it may be seen that when the phase compensation is not applied, a phase difference is greater than about 40 degrees. On the other hand, comparing the graph of G31 with the graph of G34 illustrated in FIG. 15A, it may be seen that when the phase compensation is applied, the phase difference is about 20 degrees or less and phase discontinuity is reduced.

Comparing the graphs illustrated in FIGS. 15A and 15B, it may be seen that when the phase compensation is applied, the phase compensation is performed at about 10 to 20 degrees as compared to the case where the phase compensation is not applied.

That is, in the example of using the variable attenuation circuit, the isolation may not be degraded when going from the high gain mode to the low gain mode. In addition, a low-noise amplifier (LNA) with a highly competitive topology that may satisfy all the specifications required by a communications system through the various gains and noise figures and a significant reduction in phase discontinuity may be secured.

As set forth above, according to various examples in the present disclosure, in the variable gain low noise amplifying apparatus having the attenuation circuit, various combinations of amplification gains may be implemented by varying a plurality of attenuation rates (attenuation values) and amplification rates (amplifier gains), the attenuation circuit of the input terminal may compensate for the phase distortion generated by varying various amplification gains, and phase discontinuity due to the variation of the amplification gain may be thus reduced.

Accordingly, in the variable gain low noise amplifying apparatus having various gains, phase discontinuity minimization may be obtained while satisfying the noise figure and the linearization specification over various gains, so that the topology of the low noise amplifying apparatus which is competitive in terms of performance may be secured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying apparatus comprising:
    a variable gain amplifying circuit configured to operate in a gain mode selected from a plurality of gain modes in response to a first control signal during operation in an amplification mode;
    a variable attenuation circuit configured to have an attenuation value that is adjusted in response to a second control signal, and a phase compensation value which compensates for a phase distortion in the selected gain mode; and
    a control circuit configured to control, based on the first and second control signals, the selecting of the gain mode, the adjusting of the attenuation value, and a selection of the phase compensation value.

2. The apparatus of claim 1, wherein the variable attenuation circuit is connected between a main input terminal and an input terminal of the variable gain amplifying circuit.

3. The apparatus of claim 2, wherein the variable attenuation circuit comprises first to n-th attenuation circuits which are connected in parallel between the main input terminal and the input terminal of the variable gain amplifying circuit, and are selectively in an ON state during operation in the amplification mode, and each of the first to n-th attenuation circuits has each of first to n-th phase compensation values which compensate for the phase distortion in each of the plurality of gain modes;

wherein "n" is a natural number equal to or greater than 2.

4. The apparatus of claim 3, wherein the first attenuation circuit comprises:
  a first switch and a second switch connected in series between the main input terminal and the input terminal of the variable gain amplifying circuit;
  a first resistor and a second resistor connected in series between the first switch and the second switch; and
  a first phase compensating capacitor which is connected between a connection node between the first and second resistors and a ground.

5. The apparatus of claim 4, wherein the n-th attenuation circuit comprises:
  a first switch and a second switch connected in series between the main input terminal and the input terminal of the variable gain amplifying circuit;
  a first resistor and a second resistor connected in series between the first switch and the second switch; and
  an n-th phase compensating capacitor which is connected between a connection node between the first and second resistors and the ground.

6. The apparatus of claim 1, wherein the variable gain amplifying circuit comprises:
  an amplifying circuit configured to amplify a signal obtained through an input terminal of the variable gain amplifying circuit; and
  an output load circuit connected between an output terminal of the amplifying circuit and an output terminal of the variable gain amplifying circuit, and configured to vary a resistance value and a capacitance value to control a gain of the amplifying circuit and a return loss at the output terminal of the variable gain amplifying circuit based on the first control signal.

7. The apparatus of claim 3, wherein each of the first to n-th attenuation circuits comprises a resistance value that is varied to obtain different attenuation values, and a capacitance value that is varied to obtain different phase compensation values.

8. The apparatus of claim 3, wherein at least one of the first to n-th attenuation circuits is configured to be in an ON state to perform an operation to compensate for an attenuation and phase distortion for a signal obtained through the main input terminal.

9. The apparatus of claim 1, further comprising a bypass circuit connected in parallel with the variable attenuation circuit and the variable gain amplifying circuit between a main input terminal and an output terminal and configured to be in an ON state during an operation of a bypass mode in response to a third control signal.

10. An apparatus comprising:
  a variable gain amplifying circuit configured to operate in a gain mode selected from a plurality of gain modes in response to a first control signal during operation in an amplification mode;
  a variable attenuation circuit configured to have an attenuation value that is adjusted in response to a second control signal, and a phase compensation value which compensates for a phase distortion in the selected gain mode; and
  a bypass circuit connected in parallel with the variable gain amplifying circuit and configured to transmit a signal output from the variable attenuation circuit to an output terminal of the variable gain amplifying circuit during an operation in a bypass mode in response to a third control signal, wherein the variable attenuation circuit comprises:
  an attenuation bypass circuit configured to be in an ON state during operation in the bypass mode, and
  first to n-th attenuation circuits connected in parallel with the attenuation bypass circuit and are selectively configured to be in the ON state during the operation in the amplification mode;

wherein "n" is a natural number equal to or greater than 2.

11. The apparatus of claim 10, wherein the variable attenuation circuit is connected between a main input terminal and an input terminal of the variable gain amplifying circuit.

12. The apparatus of claim 10, wherein each of the first to n-th attenuation circuits has each of first to n-th phase compensation values which compensate for a phase distortion in each of the plurality of gain modes.

13. The apparatus of claim 12, wherein the first attenuation circuit comprises:
  a first switch and a second switch connected in series between the main input terminal and the input terminal of the variable gain amplifying circuit;
  a first resistor and a second resistor connected in series between the first switch and the second switch; and
  a first phase compensating capacitor which is connected between a connection node between the first and second resistors and a ground.

14. The apparatus of claim 13, wherein the n-th attenuation circuit comprises:
  a first switch and a second switch connected in series between the main input terminal and the input terminal of the variable gain amplifying circuit;
  a first resistor and a second resistor connected in series between the first switch and the second switch; and
  an n-th phase compensating capacitor which is connected between a connection node between the first and second resistors and the ground.

15. The apparatus of claim 10, wherein the variable gain amplifying circuit comprises:
  an amplifying circuit configured to amplify a signal obtained through an input terminal of the variable gain amplifying circuit; and
  an output load circuit connected between an output terminal of the amplifying circuit and an output terminal of the variable gain amplifying circuit, and configured to vary a resistance value and a capacitance value to control a gain of the amplifying circuit and a return loss at the output terminal of the variable gain amplifying circuit based on the first control signal.

16. The apparatus of claim 12, wherein each of the first to n-th attenuation circuits comprises a resistance value that is varied to obtain different attenuation values, and a capacitance value that is varied to obtain different phase compensation values.

17. The apparatus of claim 10, wherein at least one of the first to n-th attenuation circuits is configured to be in an ON state to perform an operation to compensate for an attenuation and phase distortion for a signal obtained through the main input terminal.

18. A method comprising:
- selecting a gain mode from a plurality of gain modes of a variable gain amplifying circuit in response to a first control signal during operation in an amplification mode; and
- adjusting an attenuation value and a phase compensation value in a variable attenuation circuit in response to a second control signal to compensate for a phase distortion in the selected gain mode,
- wherein the adjusting of the attenuation value and the phase compensation value are based on the first control signal and the second control signal.

19. The method of claim 18, further comprising transmitting a signal output from the variable attenuation circuit to an output terminal of the variable attenuation circuit during an operation in a bypass mode in response to a third control signal.

* * * * *